United States Patent
Kobayashi et al.

(10) Patent No.: US 7,772,689 B2
(45) Date of Patent: Aug. 10, 2010

(54) SEMICONDUCTOR PACKAGE WITH A CONDUCTIVE POST AND WIRING PATTERN

(75) Inventors: Tsuyoshi Kobayashi, Nagano (JP); Tetsuya Koyama, Nagano (JP); Takaharu Yamano, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 414 days.

(21) Appl. No.: 11/470,432

(22) Filed: Sep. 6, 2006

(65) Prior Publication Data

US 2007/0052071 A1     Mar. 8, 2007

(30) Foreign Application Priority Data

Sep. 7, 2005   (JP)   ............................. 2005-259723

(51) Int. Cl.
  *H01L 23/12*  (2006.01)
  *H05K 7/00*  (2006.01)

(52) U.S. Cl. .................. 257/701; 257/774; 257/784; 257/787; 257/E23.011; 361/746; 361/750; 361/809

(58) Field of Classification Search ........................ None
  See application file for complete search history.

(56) References Cited

U.S. PATENT DOCUMENTS

| 4,736,276 | A | * | 4/1988 | Ushifusa et al. | ............. 361/792 |
|---|---|---|---|---|---|
| 5,241,456 | A | * | 8/1993 | Marcinkiewicz et al. | .... 361/792 |
| 6,020,629 | A | * | 2/2000 | Farnworth et al. | .......... 257/686 |
| 6,235,554 | B1 | * | 5/2001 | Akram et al. | ............... 438/109 |
| 6,528,869 | B1 | * | 3/2003 | Glenn et al. | ............... 257/678 |
| 2004/0145044 | A1 | * | 7/2004 | Sugaya et al. | ............... 257/698 |

FOREIGN PATENT DOCUMENTS

| JP | 09-055445 | 2/1997 |
|---|---|---|
| JP | 2001-189403 | 7/2001 |
| JP | 2001-274324 | 10/2001 |
| JP | 2002-158312 | 5/2002 |

\* cited by examiner

*Primary Examiner*—Alonzo Chambliss
(74) *Attorney, Agent, or Firm*—Rankin, Hill & Clark LLP

(57) ABSTRACT

It is configured to comprise a semiconductor chip 110, a resin member 106 for forming a cavity 109 in which this semiconductor chip 110 is installed, and wiring 105 constructed of pattern wiring 105b formed so as to be exposed to an upper surface 106b of this resin member 106 and also connected to the semiconductor chip 110 and a post part 105a in which one end is connected to the pattern wiring 105b and also the other end is formed so as to be exposed to a lower surface 106a of the resin member 106.

10 Claims, 15 Drawing Sheets

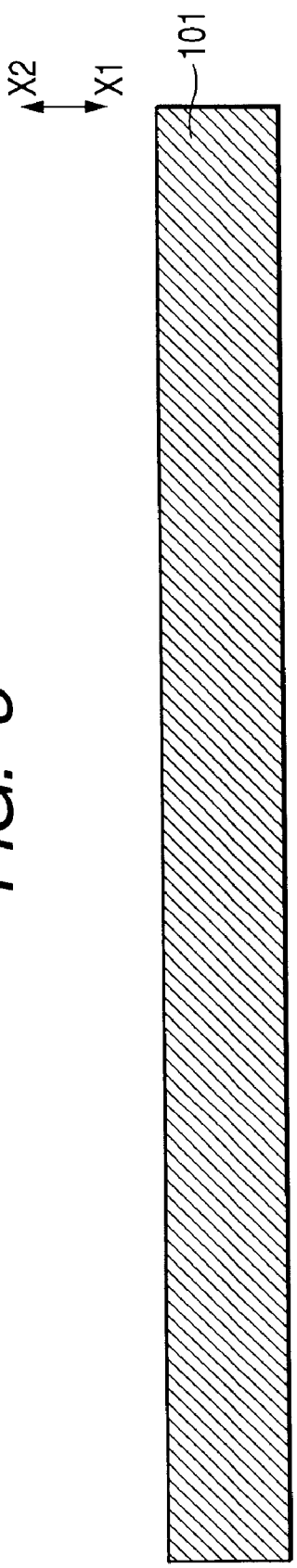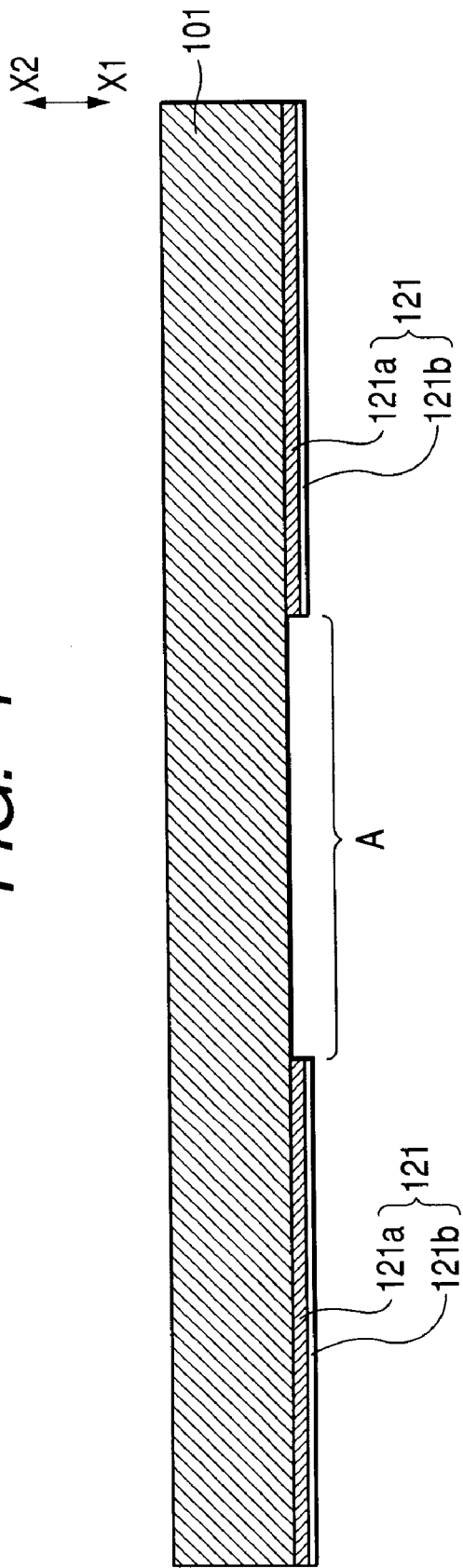

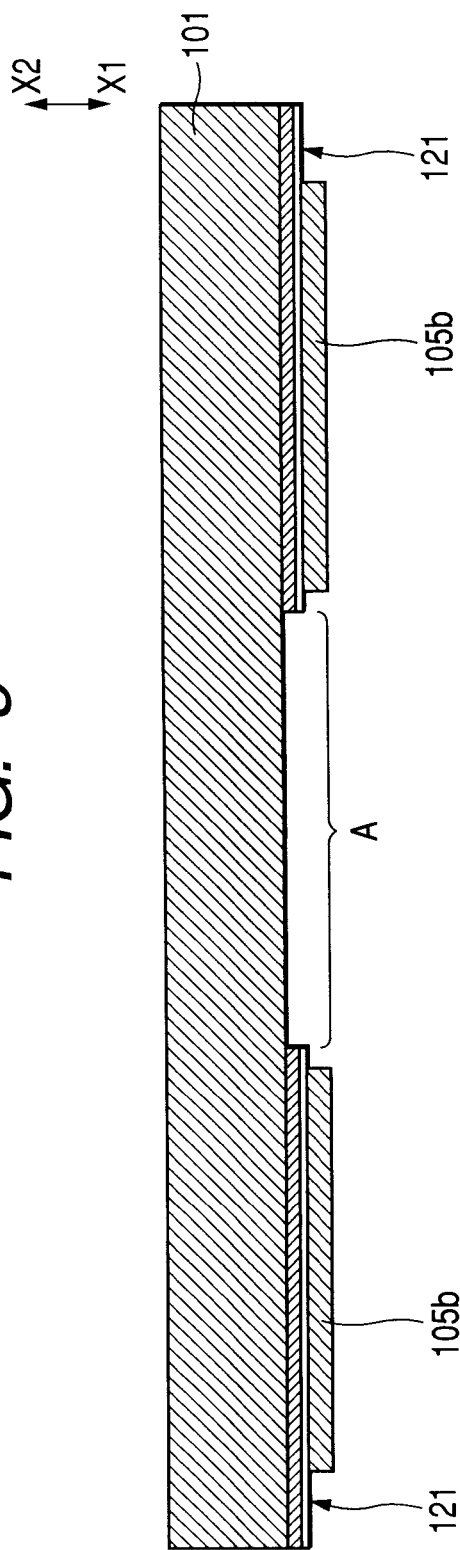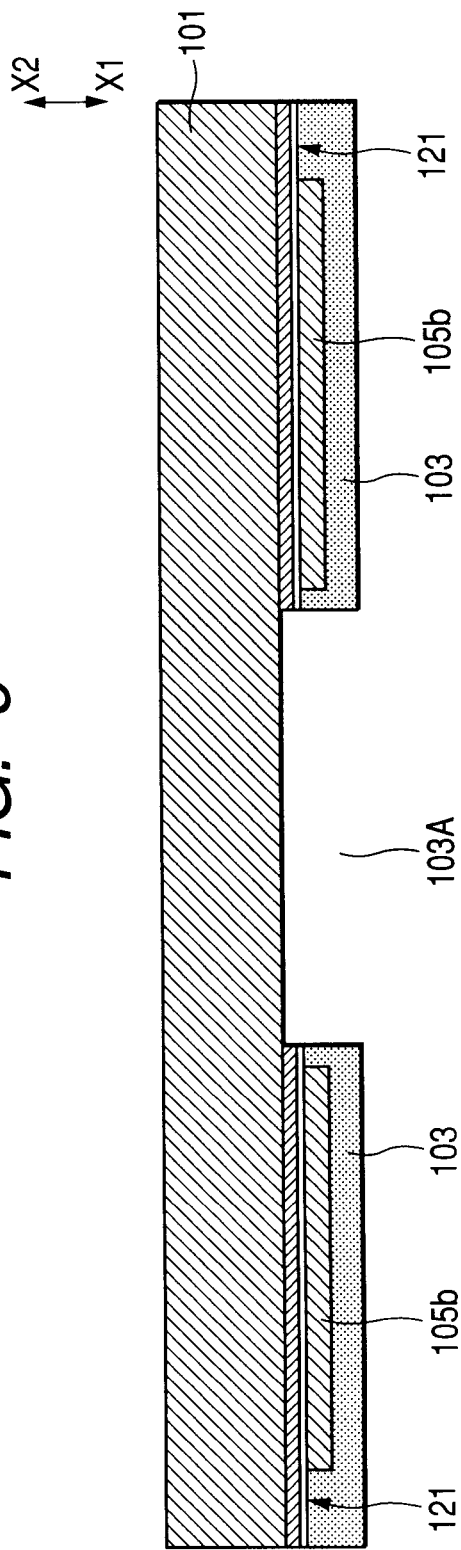

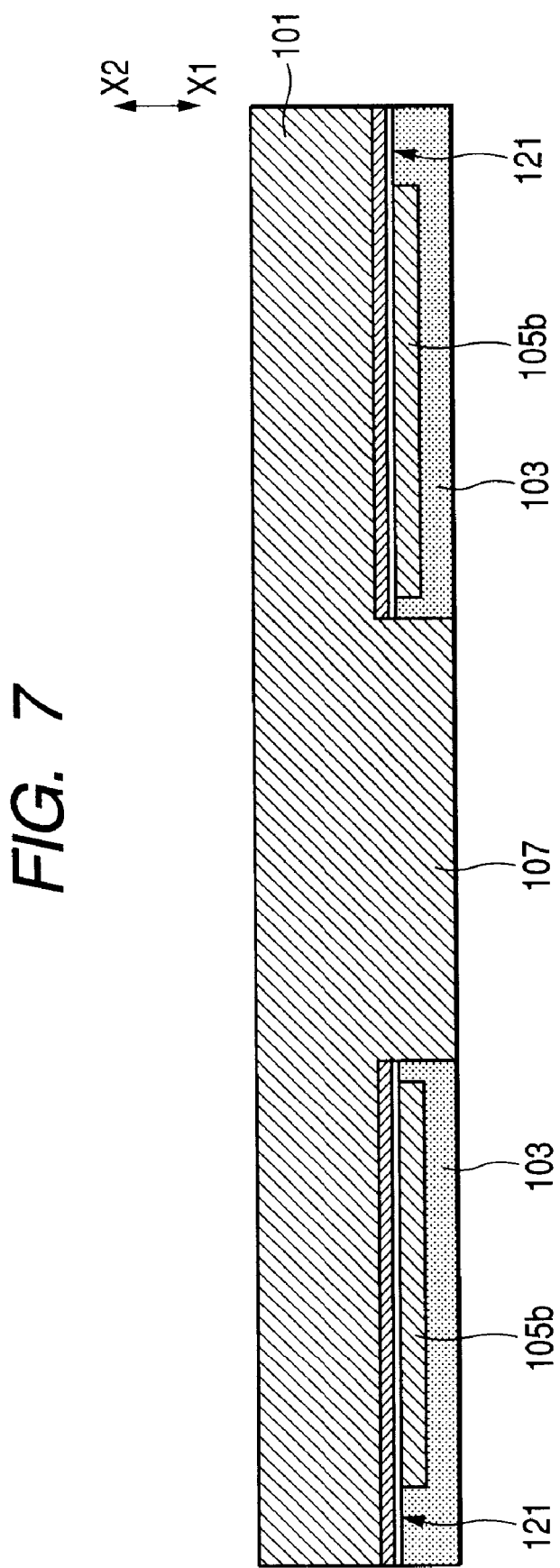

SEMICONDUCTOR PACKAGE WITH A CONDUCTIVE POST AND WIRING PATTERN

TECHNICAL FIELD

The present disclosure relates to a semiconductor package and a manufacturing method thereof, and particularly to a semiconductor package mounted in three dimensions and a manufacturing method thereof.

RELATED ART

In recent years, miniaturization and thinning have been strongly desired in electronic equipment etc. in which a semiconductor package is mounted. Because of this, a package structure referred to as the so-called package-on-package (POP) in which three-dimensional mounting can be performed by laminating the semiconductor packages in order to improve a mounting density of the semiconductor packages has been proposed (for example, see Patent Reference 1: Japanese Patent Unexamined Publication No. 2002-158312).

In this kind of semiconductor package, a resin substrate in which wiring is formed is previously made and a component such as a semiconductor chip is installed on this resin substrate by a method of wire bonding or flip chip, etc. and thereafter, a sealing resin is formed by a molding resin or an epoxy resin.

Then, by irradiating the sealing resin with a laser, an opening for exposing wiring on the resin substrate is formed and also wiring is formed in an opening using a plating method. As a result of this, wiring in which one end is connected to wiring of the resin substrate and the other end is exposed to an upper surface of the resin substrate is formed.

By forming the wiring extending through the sealing resin thus, another semiconductor package can be mounted on the upper surface of the resin substrate. In the related art, three-dimensional mounting of the semiconductor package could be performed by using such a technique.

However, in the related-art semiconductor package, the resin substrate is required, so that there is a problem that the semiconductor package becomes higher (thicker). Particularly, when the semiconductor packages having this resin substrate are laminated for three-dimensional mounting, a height as a whole after the lamination becomes high and it becomes difficult to reduce a height of electronic equipment etc. in which this semiconductor package is installed.

Also, in the related-art semiconductor package, it is configured to install a semiconductor chip on a resin substrate and further dispose a sealing resin so as to cover the semiconductor chip, so that there was also the problem that the semiconductor package becomes higher because of this configuration.

SUMMARY

Embodiments of the present invention provide a semiconductor package capable of achieving thinning, and a manufacturing method of the semiconductor package.

In order to solve the problems described above, the invention is characterized by taking each of the following measures.

According to a first aspect of one or more embodiments of the invention, a semiconductor package comprises a resin member having a cavity in which a semiconductor chip is installed, and a wiring having a pattern wiring part formed so as to be exposed to a first surface of the resin member and also connected to the semiconductor chip, and a post part formed so as to extend in a thickness direction of the resin member, the post part in which one end is connected to the pattern wiring part and also the other end is formed so as to be exposed to a second surface opposite to the first surface of the resin member.

According to the first aspect of the invention, the need to use a resin substrate required in the related art is eliminated, so that cost reduction and thinning of a semiconductor package can be achieved. Also, a semiconductor chip is installed inside a cavity formed in a resin member, so that a height of the semiconductor package can be reduced as compared with a configuration of being installed on the resin member.

Also, according to a second aspect of one or more embodiments of the invention, in the first aspect of the semiconductor package, a depth of the cavity is deeper than or equal to a thickness of the semiconductor chip.

According to the second aspect of the invention, a height of the semiconductor package can be reduced surely.

Also, according to a third aspect of one or more embodiments of the invention, in the first or second aspect of the semiconductor package, the post part has a columnar shape and is formed by a plating method.

According to the third aspect of the invention, the post part has a columnar shape with all the same sectional diameter, so that electrical characteristics can be improved as compared with a conic-shaped electrode etc.

Also, according to a fourth aspect of one or more embodiments of the invention, in any one of the first to third aspect of the semiconductor package, the semiconductor chip is installed in the cavity.

Also, according to a fifth aspect of one or more embodiments of the invention, a manufacturing method of a semiconductor package in which a semiconductor chip is installed on a resin member, comprises a first step of forming a pattern wiring part on a support substrate, a second step of protruding and forming a mold part in a position corresponding to an installation position of the semiconductor chip on the support substrate by a plating method, a third step of forming a wiring by forming a post part on the pattern wiring part by a plating method using a resist pattern, a fourth step of forming a resin member by arranging a resin for sealing the mold part and the post part, and a fifth step of removing the support substrate together with the mold part and forming a cavity part in the resin member.

According to the fifth aspect of the invention, a cavity corresponding to a mold part is formed in a resin member by removing a support substrate in the fifth step. Therefore, the cavity with high accuracy can be formed simply as compared with a method for forming the cavity separately after the resin member is formed.

Also, according to a sixth aspect of one or more embodiments of the invention, the fifth aspect of the manufacturing method of a semiconductor package further comprises a sixth step of installing the semiconductor chip in the cavity part and also connecting the semiconductor chip to the pattern wiring part.

Also, according to a seventh aspect of one or more embodiments of the invention, in the fifth or sixth aspect of the manufacturing method of a semiconductor package, in the fourth step, a liquid resin is used as material of the resin member and after the liquid resin is arranged on the support substrate, the liquid resin is cured and the resin member is formed.

According to the seventh aspect of the invention, a liquid resin is used as material of the resin member and thereby, post parts can be sealed surely by the resin member even when multiple post parts are formed on a pattern wiring part so as to extend in a thickness direction.

Also, according to an eighth aspect of one or more embodiments of the invention, in the sixth or seventh aspect of the manufacturing method of a semiconductor package, in the sixth step, the semiconductor chip is connected to the pattern wiring part by wire bonding.

According to the eighth aspect of the invention, the semiconductor chip is connected to the pattern wiring part by wire bonding and thereby, the connection can be made with high reliability. Also, a liquid resin is used as material of the sealing resin and thereby, a wire can be prevented from being deformed by arrangement of the liquid resin even when the semiconductor chip is connected to the pattern wiring part by the wire.

Also, according to a ninth aspect of one or more embodiments of the invention, in any one of the fifth to eighth aspect of the manufacturing method of a wiring substrate, in the first step, the pattern wiring part is formed after a stop layer is formed on the support substrate, and in the fifth step, removal of the support substrate is stopped by the stop layer.

According to the ninth aspect of the invention, removal of the support substrate is stopped by the stop layer, so that removal process of the support substrate can be prevented from having an influence on a layer of the inside from the stop layer. Also, management of removal process in the removal of the support substrate is facilitated and manufacture of the semiconductor package can be simplified.

Various implementations may include one or more the following advantages. For example, a semiconductor chip is installed inside a cavity formed in a resin member, so that a height of a semiconductor package can be reduced. Also, the need to use a resin substrate required in the related art is eliminated, so that cost reduction and thinning of the semiconductor package can be achieved.

Other features and advantages may be apparent from the following detailed description, the accompanying drawings and the claims.

BRIEF DESCRIPTION OF THE DRAWINGS

FIG. 3 is a diagram showing a manufacturing method of the semiconductor package which is one embodiment of the invention by following a procedure (first).

FIG. 4 is a diagram showing the manufacturing method of the semiconductor package which is one embodiment of the invention by following a procedure (second).

FIG. 5 is a diagram showing the manufacturing method of the semiconductor package which is one embodiment of the invention by following a procedure (third).

FIG. 6 is a diagram showing the manufacturing method of the semiconductor package which is one embodiment of the invention by following a procedure (fourth).

FIG. 7 is a diagram showing the manufacturing method of the semiconductor package which is one embodiment of the invention by following a procedure (fifth).

DETAILED DESCRIPTION

Next, the best mode for carrying out the invention will be described together with the drawings.

Figure 1:
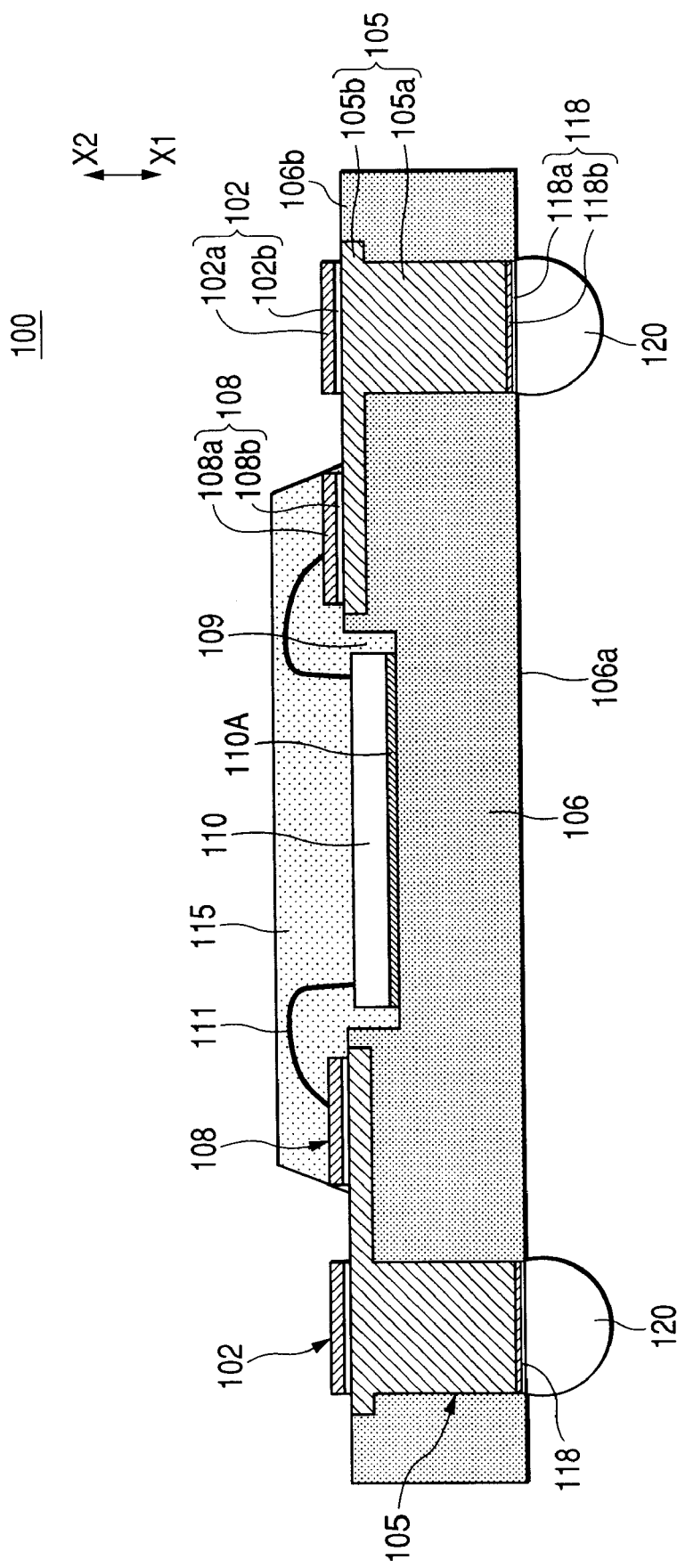
FIG. 1 is a sectional view showing a semiconductor package which is one embodiment of the invention.
Figure 2:
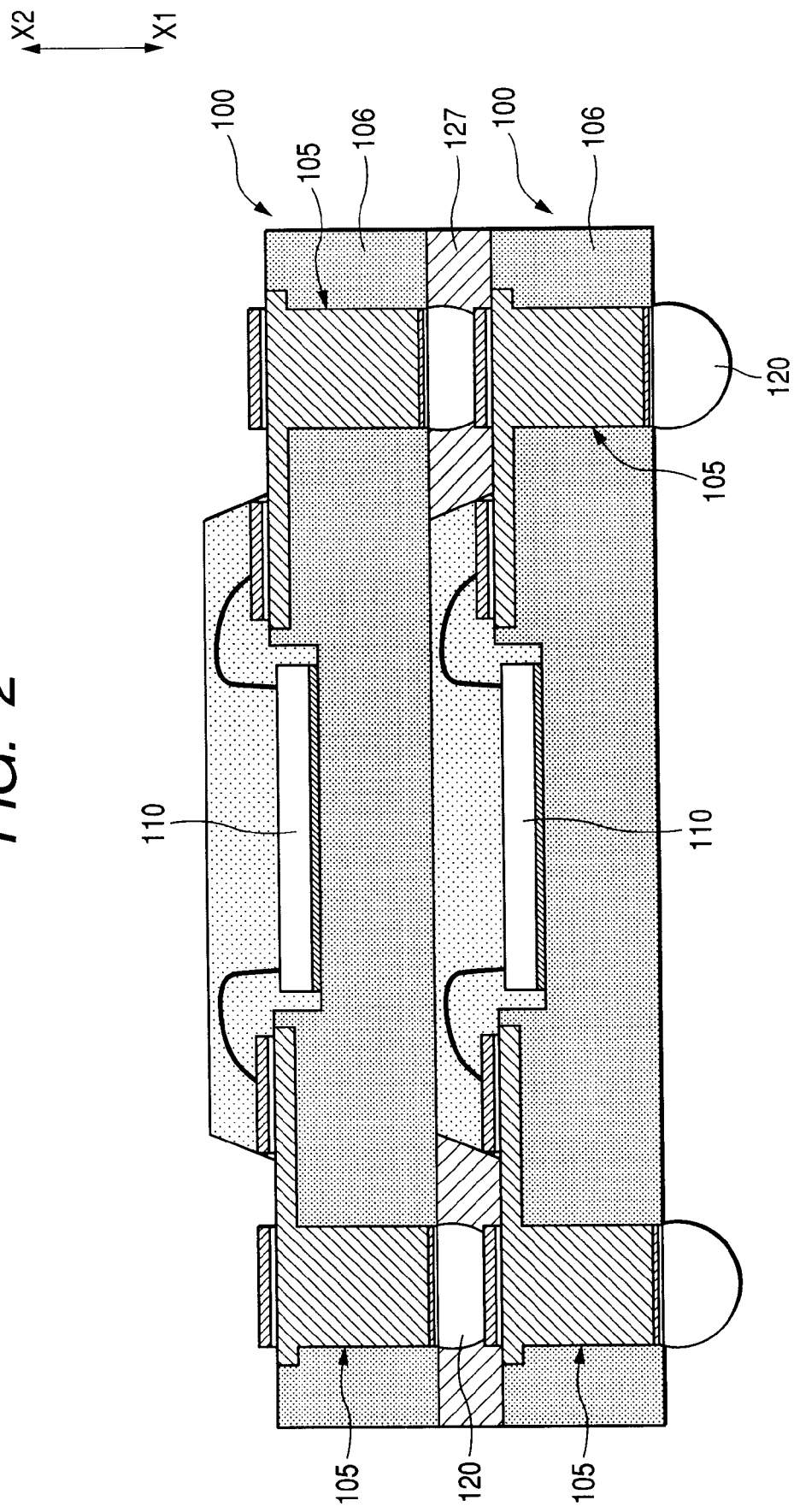
FIG. 2 is a sectional view showing a state of laminating two layers of the semiconductor packages shown in FIG. 1.

FIG. 1 is a sectional view schematically showing a semiconductor package 100 which is one embodiment of the invention, and FIG. 2 shows a state in which three-dimensional mounting is performed by laminating two semiconductor packages 100. This semiconductor package 100 is broadly constructed of wiring 105, a resin member 106, a semiconductor chip 110 and a sealing resin 115, etc.

The wiring 105 is configured to integrally form a post part 105a and pattern wiring 105b. In the drawing, two wirings 105 are illustrated and multiple wirings 105 are formed in correspondence with electrode pads etc. formed on the semiconductor chip 110. This wiring 105 is formed by Cu (copper) with good conductivity.

The post part 105a is formed so as to extend in a thickness direction (upward and downward directions in the drawing) of the resin member 106 functioning as a substrate. Also, the post part 105a has a columnar shape and is formed by a plating method as described below. An electrode 118 is formed on the lower end of this post part 105a by sequentially laminating a Ni layer 118b and an Au layer 118a.

This electrode 118 is exposed from a lower surface 106a (corresponding to a second surface described in the claim) of the resin member 106. Also, the upper end of the post part 105a is configured to be connected to the pattern wiring 105b. In addition, it is assumed that a direction shown by arrow X1 in the drawing is a downward direction and a direction shown by arrow X2 in the drawing is an upward direction in the following description.

The pattern wiring 105b is formed on the resin member 106 so as to extend by a predetermined pattern. An upper surface of this pattern wiring 105b is exposed from an upper surface 106b (corresponding to a first surface described in the claim) of the resin member 106.

An electrode 102 in which an Ni layer 102b and an Au layer 102a are sequentially laminated and a bonding pad 108 in which an Ni layer 108b and an Au layer 108a are sequentially laminated similarly are formed on a surface exposed from the upper surface 106b of the pattern wiring 105b. This electrode 102 and the bonding pad 108 are collectively formed as described below.

The semiconductor chip 110 is configured to be installed inside a cavity 109 formed in the resin member 106. In the embodiment, the semiconductor chip 110 is formed face up and a wire 111 is arranged between an electrode pad (not shown) formed on an upper surface of the semiconductor chip 110 and the bonding pad 108 formed on the wiring 105 by a wire bonding method. As a result of this, the semiconductor chip 110 is configured to be electrically connected to the wiring 105 (post part 105a, pattern wiring 105b) through the wire 111.

In addition, a die attachment film layer 110A is disposed on a lower portion of the semiconductor chip 110, and this die attachment film layer 110A is configured to be joined to the bottom surface of the cavity 109. Also, the embodiment is configured to connect the semiconductor chip 110 to the wiring 105 by the wire bonding method, but the semiconductor chip 110 can also be connected to the wiring 105 by flip chip bonding. In this case, the need for the die attachment film layer 110A or the cavity 109 is eliminated.

The resin member 106 is a substance in which a liquid resin is cured as described below. As material of this the resin member 106, for example, an epoxy liquid potting material or a liquid molding material can be used and a liquid crystal polymer can also be used.

This resin member 106 is formed so as to cover the wiring 105. However, the lower surface (on which the electrode 118 is formed) of the post part 105a constructing the wiring 105 and the upper surface of the pattern wiring 105b constructing the wiring 105 are configured to be exposed from the resin member 106.

The semiconductor packages 100 configured as described above are mounted in three dimensions by joining an external connection terminal 120 made of a solder ball of the semiconductor package 100 located in the upper portion to the electrode 102 of the semiconductor package 100 located in the lower portion as shown in FIG. 2. In this case, an NCF 127 (Non-Conductive Film) made of resin is arranged between the semiconductor package 100 located in the upper portion and the semiconductor package 100 located in the lower portion.

In the case of joining a pair of the upper and lower semiconductor packages 100, this NCF 127 is previously arranged on the semiconductor package 100 located in the lower portion. Then, the NCF 127 is simultaneously cured in the case of joining the external connection terminal 120 of the semiconductor package 100 located in the upper portion to the electrode 102 of the semiconductor package 100 located in the lower portion. As a result of this, joint reliability of the semiconductor packages 100 mounted in three dimensions can be improved. In addition, installation of this NCF 127 is not indispensable.

The semiconductor package 100 configured as described above has a configuration in which the semiconductor chip 110 is installed inside the cavity 109 formed in the resin member 106. Therefore, it is in a state in which a thickness of the semiconductor chip 110 overlaps with a thickness of the resin member 106 when viewed from the side, and a height of the semiconductor package 100 can be reduced.

Also, unlike the related-art semiconductor package, a resin substrate is not used in the semiconductor package 100 according to the embodiment. As a result of this, the semiconductor package 100 can be thinned by the thickness of the resin substrate used in the related art and also, the number of components can be reduced and thereby cost reduction can be achieved.

Next, a manufacturing method of the semiconductor package 100 configured as described above will be described using FIGS. 3 to 17.

In order to manufacture the semiconductor package 100, a support substrate 101 made of a conductive material (for example, Cu) is first prepared as shown in FIG. 3. Next, a stop layer 121 is formed on a lower surface of this support substrate 101 using an electrolytic plating method. This stop layer 121 has a structure in which an Au layer 121a with a thickness of 0.1 to 0.2 μm and an Ni layer 121b with a thickness of 0.1 to 3 μm are laminated. In this case, the stop layer 121 is formed excluding a chip installation correspondence position A (position in which a mold part 107 described below is formed) as shown in FIG. 4.

As a concrete formation method, a resist pattern (not shown) is first formed on the support substrate 101 in the chip installation correspondence position A by a photolithography method. Next, an Au layer 121a and an Ni layer 121b are sequentially precipitated by electrolytic plating using this resist pattern as a mask and then the resist pattern is removed. As a result of this, the stop layer 121 is formed in a position excluding the chip installation correspondence position A of the support substrate 101.

In addition, in electrolytic plating of subsequent steps described below, the support substrate 101 and the stop layer 121 form a current-carrying path, so that the support substrate 101 and the stop layer 121 are preferably conductive materials.

In the next step shown in FIG. 5, pattern wiring 105b is formed on the stop layer 121. This pattern wiring 105b is formed by forming a photoresist pattern (not shown) on the stop layer 121 by a photolithography method and precipitating Cu on the stop layer 121 by electrolytic plating using this resist pattern as a mask and then removing the resist pattern.

Figure 8:
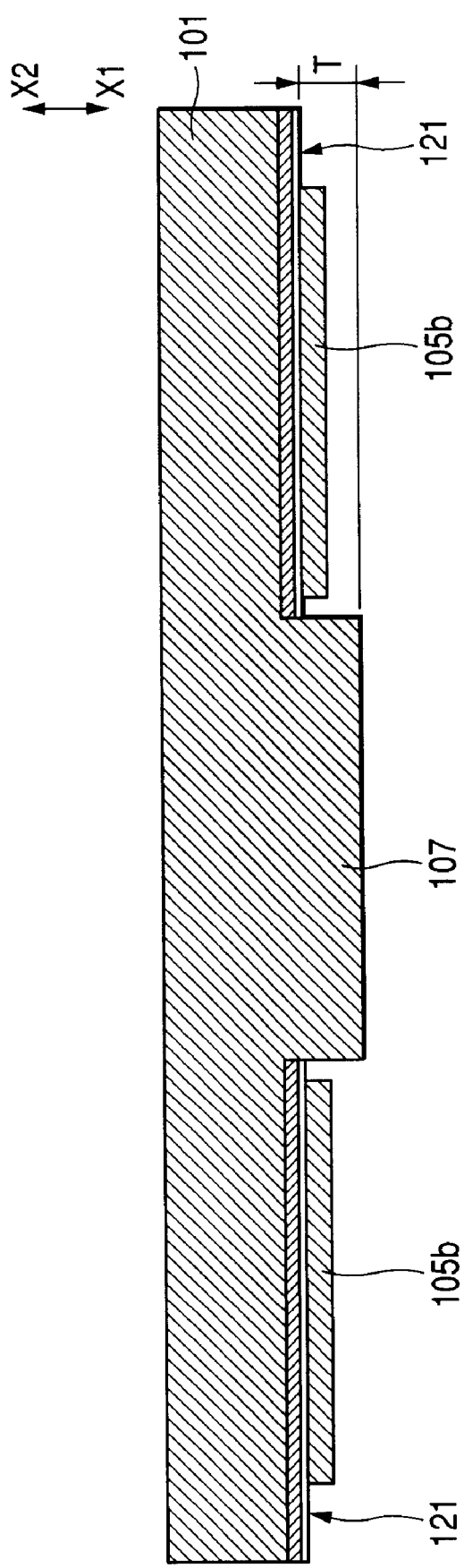
FIG. 8 is a diagram showing the manufacturing method of the semiconductor package which is one embodiment of the invention by following a procedure (sixth).

When the pattern wiring 105b is formed as described above, a formation step of a mold part 107 is subsequently performed in the embodiment. FIGS. 6 to 8 show manufacturing process of the mold part 107. In order to manufacture the mold part 107, a photoresist pattern 103 having an opening 103A is first formed as shown in FIG. 6. In this photoresist pattern 103, a film-shaped photoconductive resin film is arranged so as to cover the support substrate 101 and using a mask (not shown), the portion corresponding to the chip installation correspondence position A is exposed and developed and thereby the opening 103A corresponding to the chip installation correspondence position A is formed.

Next, the mold part 107 is formed by precipitating Cu by electrolytic plating using this photoresist pattern 103 as a mask. FIG. 7 shows a state in which the mold part 107 is formed inside the opening 103A. Subsequently, the mold part 107 is formed by removing the photoresist pattern 103 as shown in FIG. 8.

This mold part 107 is formed so as to correspond to an installation position and a shape of a semiconductor chip 110 described below. Concretely, a shape of the mold part 107 when viewed from the bottom is formed slightly larger than a shape of the semiconductor chip 110 when viewed from the plane and also, a height (shown by arrow T in FIG. 8) of the mold part 107 is set larger than or equal to a thickness (including a thickness of a die attachment film layer 110A) of the semiconductor chip 110. Therefore, the mold part 107 is formed in a shape downward protruding beyond a lower surface of the support substrate 101.

When the mold part 107 is formed on the support substrate 101 as described above, formation process of a post part 105a is subsequently performed. In order to form the post part 105a, a photoresist pattern 104 is formed so as to cover the support substrate 101 on which the pattern wiring 105b and the mold part 107 are formed.

Figure 9:
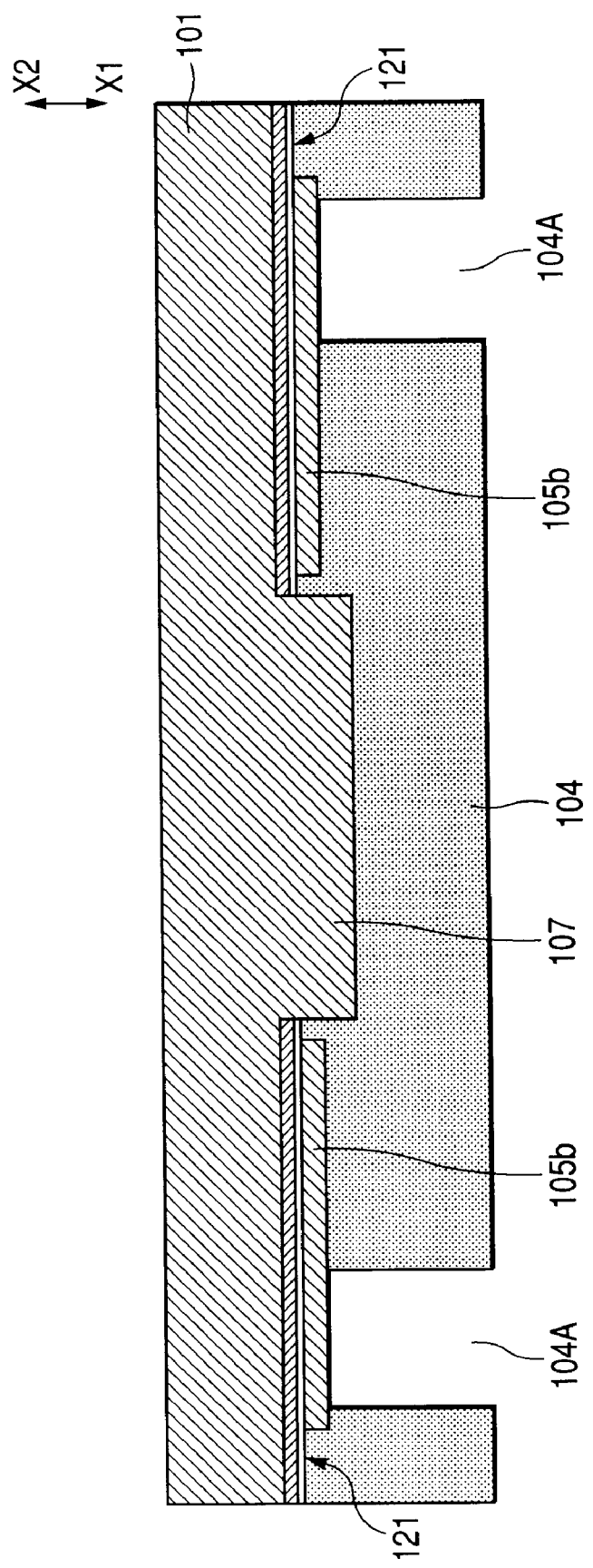
FIG. 9 is a diagram showing the manufacturing method of the semiconductor package which is one embodiment of the invention by following a procedure (seventh).

In this photoresist pattern 104, a photoresist is first applied to the support substrate 101 at a predetermined thickness using a spinner etc. or a photoresist film having a predetermined thickness is arranged and this photoresist is patterned by a photolithography method and thereby, the photoresist pattern 104 having openings 104A is formed. FIG. 9 shows a state in which the photoresist pattern 104 having the openings 104A is formed on the support substrate 101.

Figure 10:
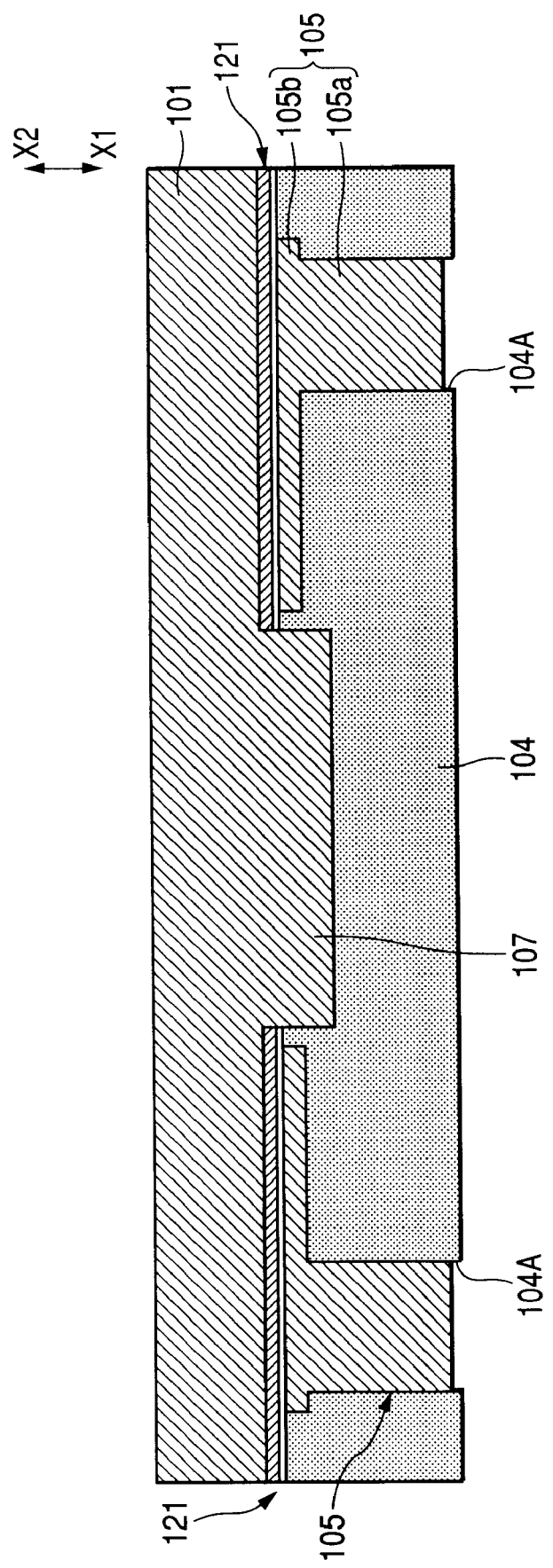
FIG. 10 is a diagram showing the manufacturing method of the semiconductor package which is one embodiment of the invention by following a procedure (eighth).

Then, in a step shown in FIG. 10, using this photoresist pattern 104 as a mask, Cu is precipitated by electrolytic plating and the post parts 105a are precipitated inside the openings 104A. As a result of this, wiring 105 made of the post part 105a and the pattern wiring 105b is formed.

The post part 105a formed thus is configured to extend in upward and downward directions in the drawing (a thickness direction of the semiconductor package 100). Also, the upper end of the post part 105a is configured to be integrally connected to the pattern wiring 105b and the lower end is configured to be exposed to the outside from the opening 104A.

Figure 11:
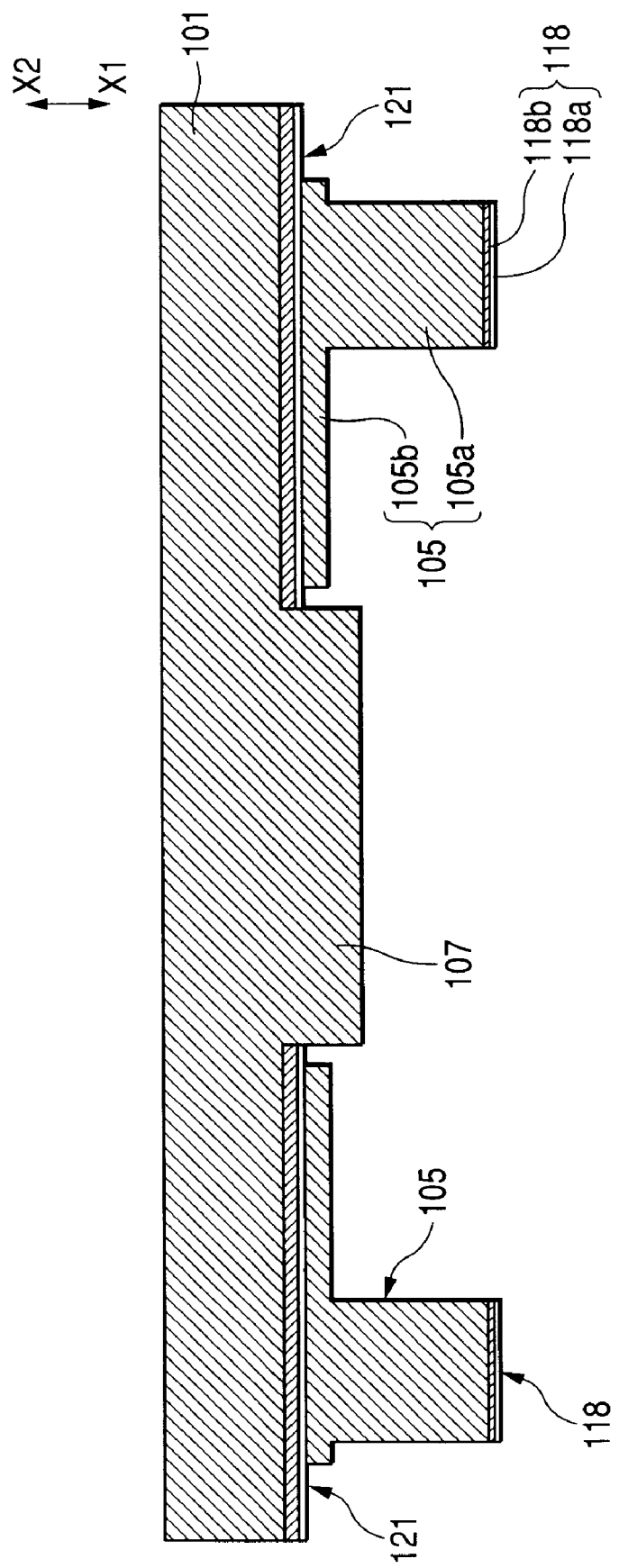
FIG. 11 is a diagram showing the manufacturing method of the semiconductor package which is one embodiment of the invention by following a procedure (ninth).

Then, an electrode 118 is formed on the end exposed from the opening 104A of the post part 105a. This electrode 118 is formed by sequentially laminating an Ni layer 118b and an Au layer 118a using an electrolytic plating method. When the post part 105a (wiring 105) and the electrode 118 are formed as described above, the photoresist pattern 104 is removed. FIG. 11 shows a state in which the photoresist pattern 104 is removed.

Figure 12:
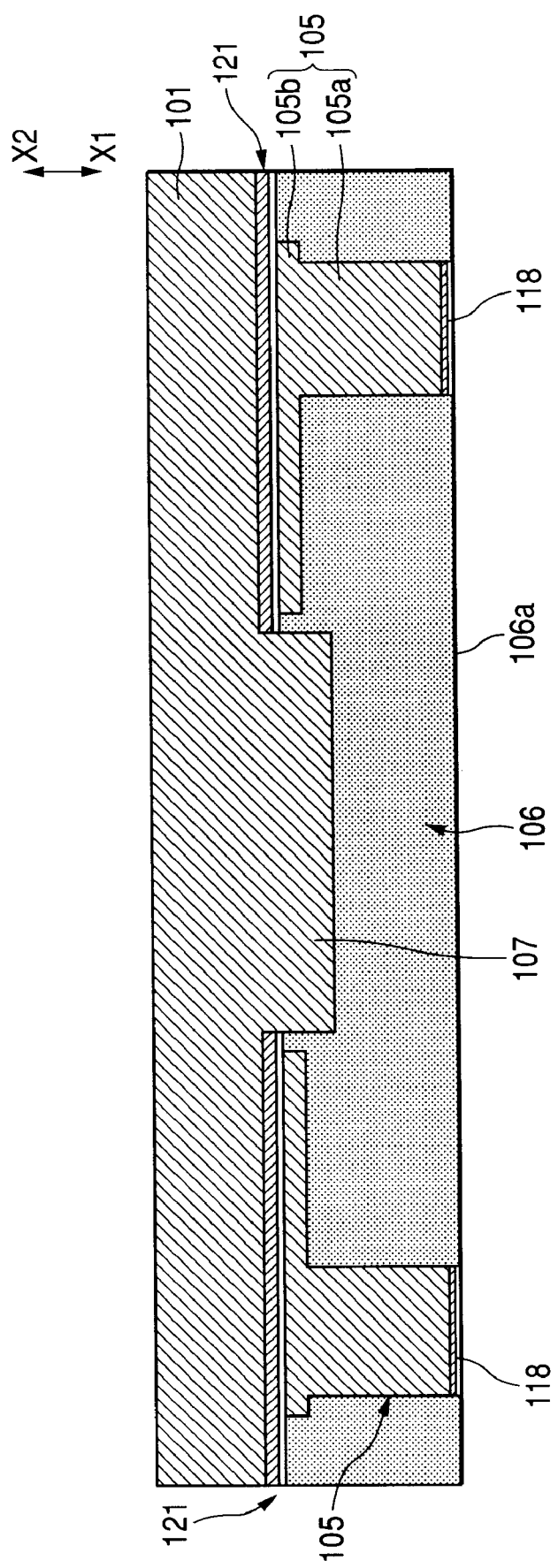
FIG. 12 is a diagram showing the manufacturing method of the semiconductor package which is one embodiment of the invention by following a procedure (tenth).

Then, in a step shown in FIG. 12, a resin member 106 is formed. The embodiment is characterized by using a liquid resin as material of the resin member 106. As the liquid resin, an epoxy liquid potting material or a liquid molding material can be used and a liquid crystal polymer can also be used. In addition, when the liquid potting material or the liquid molding material is used as the liquid resin, curing process is performed by heating after being arranged on the support substrate 101.

By using the liquid resin as the resin member 106 thus, the liquid resin smoothly moves between the post parts 105a even when many post parts 105a are formed on the pattern wiring 105b so as to extend (protrude) in a downward direction in the drawing. As a result of this, even when many post parts 105a are present, an air gap is not formed inside the resin member 106 and the wiring 105 and the semiconductor chip 110, etc. can be sealed surely.

In addition, polishing process may be performed with respect to a lower surface 106a of the resin member 106 in order to surely expose the electrode 118 from the resin member 106 after arrangement of the resin member 106.

Figure 13:
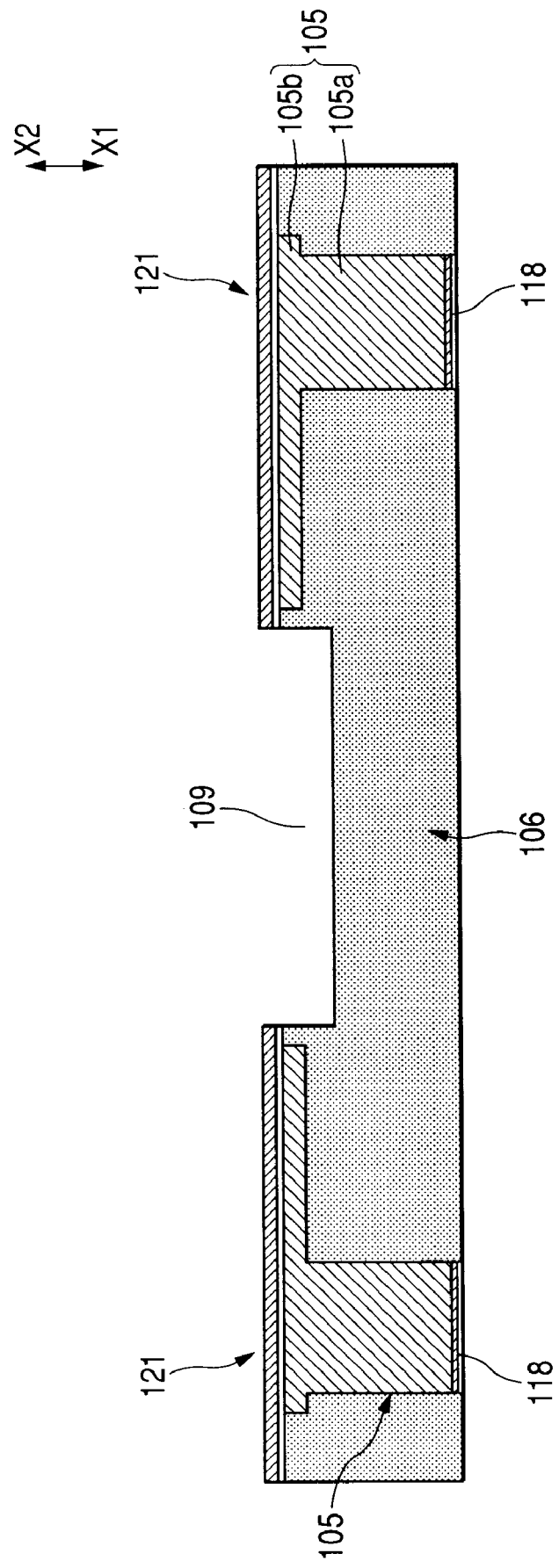
FIG. 13 is a diagram showing the manufacturing method of the semiconductor package which is one embodiment of the invention by following a procedure (eleventh).

Then, in a step shown in FIG. 13, process for removing the support substrate 101 (including the mold part 107) by etching is performed. In this case, an etching solution in which the support substrate 101 (Cu) dissolves but the stop layer 121 does not dissolve is used as the etching solution. As a result of this, removal of the support substrate 101 is stopped by the stop layer 121 and also removal of the mold part 107 is stopped by the resin member 106.

As a result of this, the etching solution can be prevented from having an influence on the wiring 105 formed inside the resin member 106. Also, management of removal process in the removal of the support substrate 101 is facilitated and manufacture of the semiconductor package 100 can be simplified.

In addition, by removing the support substrate 101, a configuration in which a member for supporting the resin member 106 is not present is formed, but at a point in time of removing the support substrate 101, the resin member 106 cures to ensure predetermined rigidity. Therefore, even when the support substrate 101 is not present, each of the steps subsequent to this can be performed.

FIG. 13 shows a state in which the support substrate 101 is removed. In removal process of this support substrate 101, the mold part 107 formed on the support substrate 101 is also removed simultaneously. As a result of this, a cavity 109 corresponding to a shape of the mold part 107 is formed in the resin member 106. The mold part 107 is formed so as to correspond to an installation position and a shape of the semiconductor chip 110 as described above. Therefore, a formation position and a shape of the cavity 109 formed using this mold part 107 as a mold also correspond to the installation position and the shape of the semiconductor chip 110.

Figure 14:
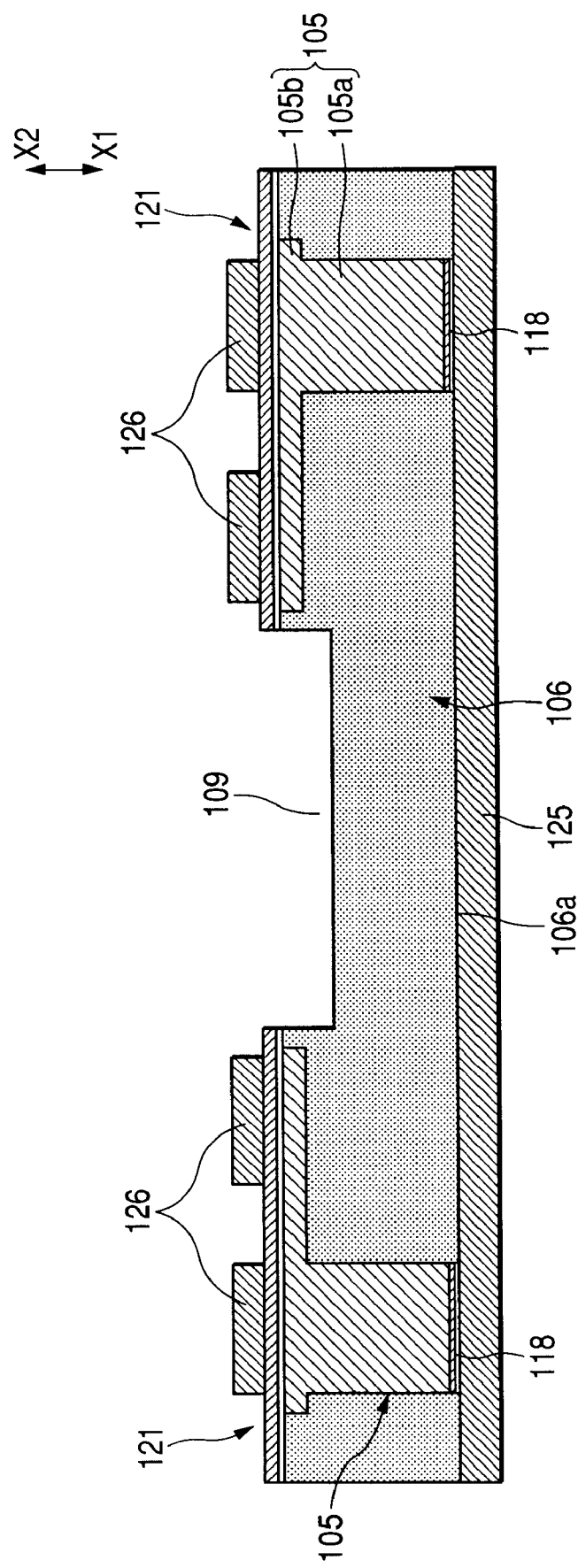
FIG. 14 is a diagram showing the manufacturing method of the semiconductor package which is one embodiment of the invention by following a procedure (twelfth).

Then, in a step shown in FIG. 14, a resist pattern 125 is formed on the lower surface 106a of the resin member 106 and also a resist pattern 126 is formed on the stop layer 121 formed on the upper surface. The resist pattern 125 is formed on all the lower surface 106a. On the other hand, the resist pattern 126 formed on the stop layer 121 is patterned using a photolithography method and thereby is formed in a position (see FIG. 2) of an electrode 102 to which an external connection terminal 120 of the semiconductor package 100 located in an upper portion at the time of three-dimensional mounting is connected and a formation position of a bonding pad 108 to which a wire 111 for making connection to the semiconductor chip 110 described below is connected.

Figure 15:
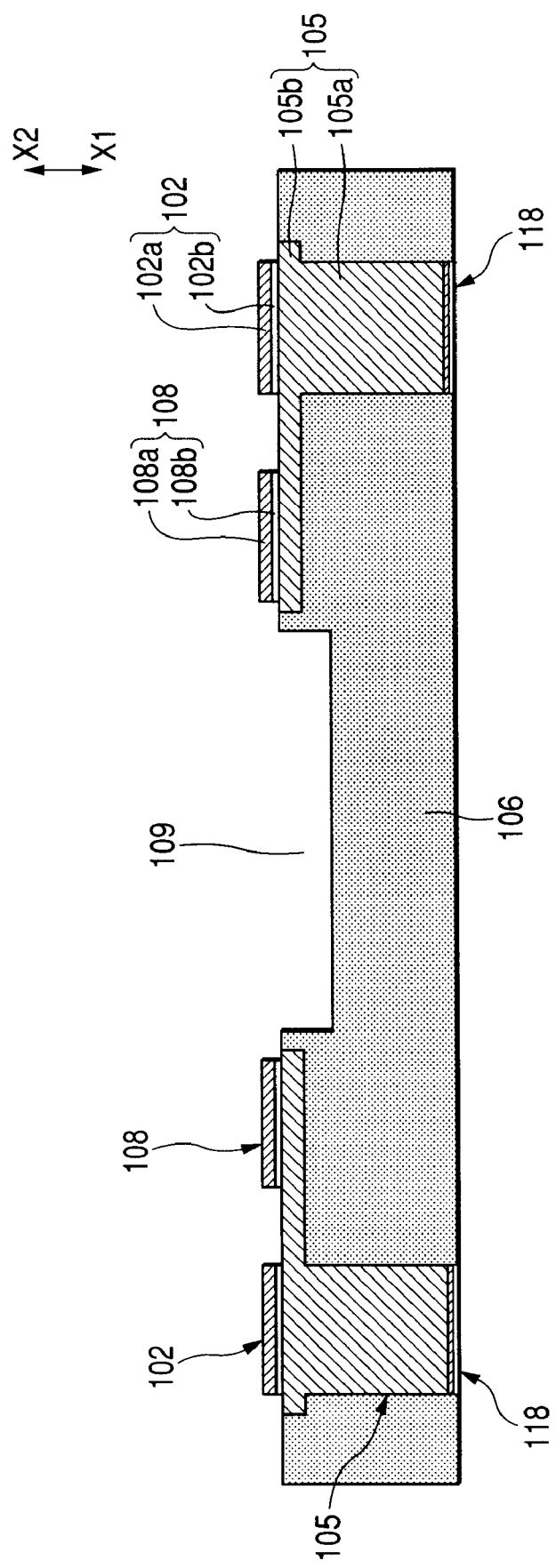
FIG. 15 is a diagram showing the manufacturing method of the semiconductor package which is one embodiment of the invention by following a procedure (thirteenth).

Then, etching process of the stop layer 121 (Au layer 121a, Ni layer 121b) is performed using the resist patterns 125, 126 as a mask. As a result of this, with the electrode 102 and the bonding pad 108 left, the other portions of the stop layer 121 are removed. Subsequently, by removing the resist patterns 125, 126, the electrode 102 and the bonding pad 108 are formed on the wiring 105 (pattern wiring 105b) as shown in FIG. 15.

Figure 16:
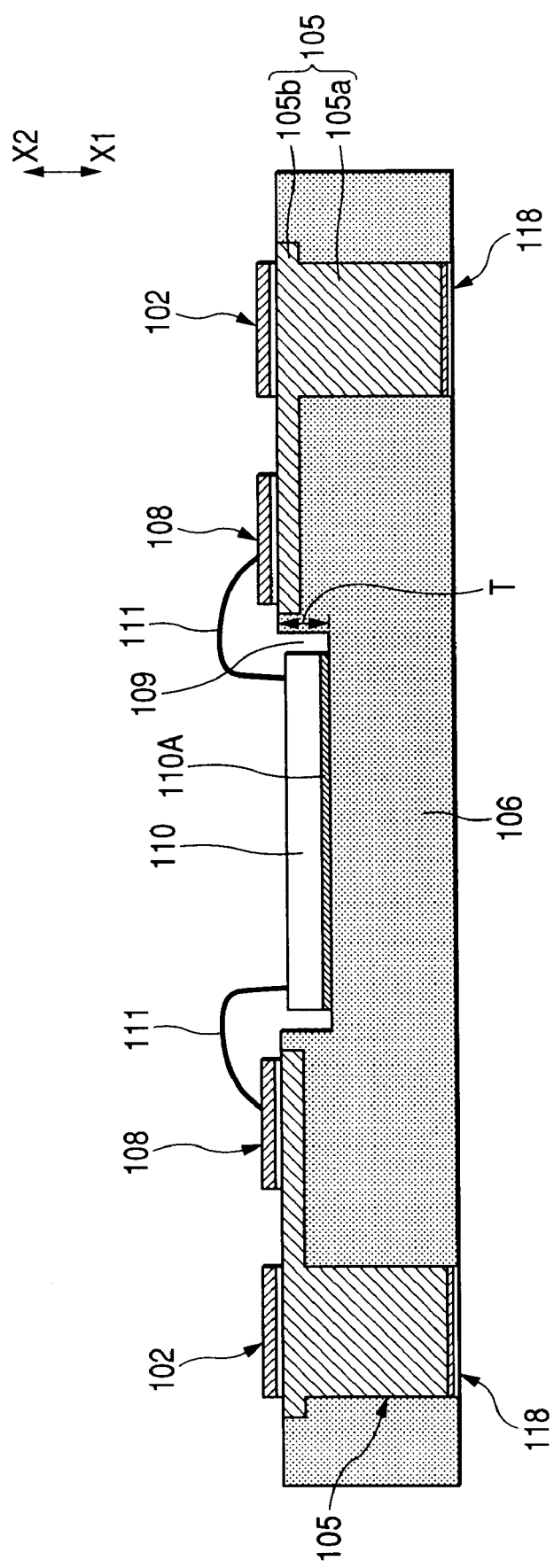
FIG. 16 is a diagram showing the manufacturing method of the semiconductor package which is one embodiment of the invention by following a procedure (fourteenth).

Then, in a step shown in FIG. 16, process for installing the semiconductor chip 110 in the cavity 109 is performed. Concretely, the semiconductor chip 110 is installed inside the cavity 109 face up using the die attachment film layer 110A.

As described above, the cavity 109 is formed in a shape corresponding to the mold part 107 and thus, a shape when viewed from the plane is formed slightly larger than a shape of the semiconductor chip 110 when viewed from the plane and also, a depth (shown by arrow T in FIG. 16) is set deeper than or equal to a thickness (including a thickness of the die attachment film layer 110A) of the semiconductor chip 110. Therefore, the semiconductor chip 110 is in a state of being embedded in the resin member 106 with the semiconductor chip 110 installed in the cavity 109.

Subsequent to this, an electrode pad formed on the semiconductor chip 110 is connected to the bonding pad 108 formed on the wiring 105 by a wire 111 using a wire bonding apparatus. As a result of this, it is configured to make electrical connection between the semiconductor chip 110 and the wiring 105. In the embodiment, a wire bonding method is used in installation of the semiconductor chip 110, so that the semiconductor chip 110 can be connected to the wiring 105 inexpensively with high reliability.

Figure 17:
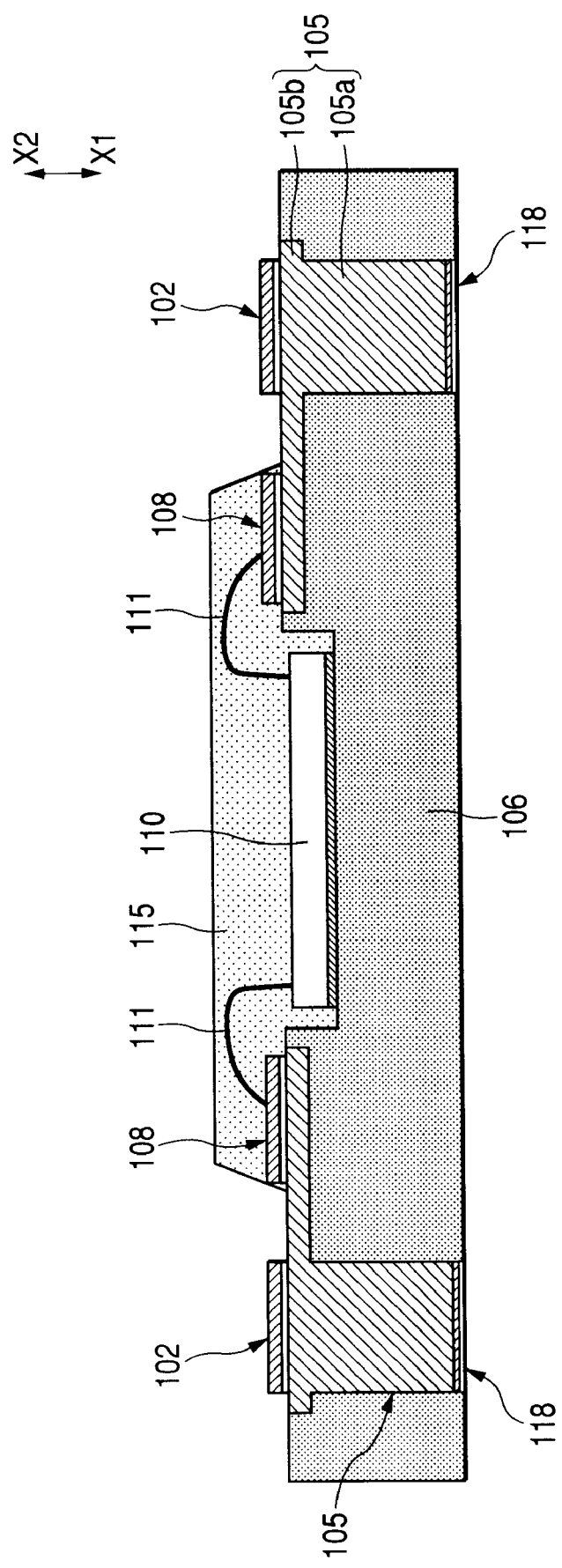
FIG. 17 is a diagram showing the manufacturing method of the semiconductor package which is one embodiment of the invention by following a procedure (fifteenth).

Then, in a step shown in FIG. 17, a sealing resin 115 for sealing the semiconductor chip 110 is formed. This sealing resin 115 is arranged in order to protect the semiconductor chip 110 and the wire 111. A molding method or a potting method may be used in formation of the sealing resin 115.

When the sealing resin 115 is formed thus, the external connection terminals 120 are formed by joining solder balls to the electrodes 118. The semiconductor package 100 shown in FIG. 1 can be formed by performing the steps described above.

In the manufacturing method according to the embodiment described above, the cavity 109 corresponding to the mold part 107 can be formed in the resin member 106 simultaneously by removing the support substrate 101. Therefore, the cavity 109 with high accuracy can be formed simply as compared with a method for forming the cavity 109 separately after the resin member 106 is formed.

Also, in the manufacturing method according to the embodiment, the post part 105a is formed by a plating method using the photoresist pattern 104. As a result of this, the opening 104A formed in the photoresist pattern 104 in order to form the post part 105a is formed using a photolithography technique, so that a pattern having a high aspect ratio with high accuracy can be formed.

By plating and forming the post part 105a using the photoresist pattern 104 thus, the post part 105a with high accuracy can be formed. Therefore, connection between the external connection terminal 120 and the electrode 102 can be made surely even when plural semiconductor packages 100 are laminated to perform three-dimensional mounting as shown in FIG. 2.

Also, by forming the post part 105a by the opening 104A having a high aspect ratio as described above, the post part 105a has a columnar shape with all the uniform cross section in a thickness direction and wiring with good electrical characteristics can be formed and it can also cope well with a high-frequency signal.

In addition, in the manufacturing method of the semiconductor package described above, a procedure for manufacturing one semiconductor package 100 from one support substrate 101 has been illustrated and described for convenience of illustration, but the so-called multiple packages are manufactured actually. That is, individual semiconductor packages 100 are manufactured by cutting in a predetermined position after multiple semiconductor packages 100 are formed on one support substrate 101.

The invention has been described above by the preferred embodiment, but the invention is not limited to the specific embodiment described above, and various modifications and changes can be made within the gist described in the claims.

Concretely, the embodiment described above has been configured to use the Au layer 121a which is noble metal together with the Ni layer 121b as the stop layer 121. However, use of the noble metal such as Au probably increases manufacturing cost of the semiconductor package 100. Hence, it may be configured to use only the Ni layer as the stop layer 121. However, in this case, for example, in the step shown in FIG. 14, after the bonding pad 108 and the electrode 102 with only the Ni layers 108b, 102b are formed, the Au layers 108a, 102a are formed on the nickel (Ni) layers 108b, 102b of the bonding pad 108 and the electrode 102 by giving electroless plating.

Also, in the embodiment described above, a depth of the cavity 109 has been set at a depth in which the semiconductor chip 110 is fully embedded in the cavity 109, but this configuration is not necessarily used. That is, as long as a configuration in which the semiconductor chip 110 partially overlaps with the resin member 106 in a state of being viewed from the plane is used, the semiconductor package 100 can be thinned by this overlap size.

What is claimed is:

1. A semiconductor package, comprising:
   a resin member having a first surface and a second surface, said first surface defining a cavity in which a semiconductor chip is received such that the semiconductor chip is surrounded by the resin member, said semiconductor chip having a first surface with a plurality of pads and a second surface, said semiconductor chip first surface facing away from said resin member, while said semiconductor chip second surface facing toward and being affixed to said resin member first surface; and
   a wiring having a pattern wiring part formed directly on the first surface of the resin member, and a post part formed so as to extend in a thickness direction of the resin member, the post part includes one end that is connected to the pattern wiring part and another end that is formed so as to be exposed to the resin member second surface, which is opposite to the resin member first surface;
   a bonding pad and an electrode are formed on an exposed surface of said pattern wiring part;
   a wire having a first end electrically connected to said bonding pad and a second end electrically connected to said semiconductor chip;
   a sealing resin disposed over the first surface of said resin member so as to cover and encapsulate said bonding pad, said wire, and said semiconductor chip; wherein said electrode is exposed from said encapsulate.

2. A semiconductor package as claimed in claim 1, wherein a depth of the cavity is deeper than or equal to a thickness of the semiconductor chip.

3. A semiconductor package as claimed in claim 1, wherein the post part has a columnar shape and is formed by a plating method.

4. A semiconductor package as claimed in claim 1, wherein the cavity is defined by a plurality of sidewalls and a bottom wall, said bottom wall being generally perpendicular to said sidewalls and extending continuously and uninterrupted between the sidewalls so as to provide a continuous support for the semiconductor chip, and wherein said sealing resin partially fills said cavity so as to be disposed between said semiconductor chip and said plurality of sidewalls.

5. A semiconductor package as claimed in claim 1, wherein a die attachment film layer is interposed between the semiconductor chip second surface and the first surface of the resin member.

6. A semiconductor package, comprising:
   a resin member having a first surface and a second surface, said first surface defining a cavity in which a semiconductor chip is received such that the semiconductor chip is surrounded by the resin member, said semiconductor chip having a first surface with a plurality of pads and a second surface, said semiconductor chip first surface facing away from said resin member, while said semiconductor chip second surface facing toward and being affixed to said resin member first surface;
   a wiring having a pattern wiring part embedded in the first surface of the resin member so as to have an exposed surface that is generally flush with said resin member first surface, and a post part formed so as to extend in a thickness direction of the resin member, the post part includes one end that is connected to the pattern wiring part and another end that is formed so as to be exposed to the resin member second surface, which is opposite to the resin member first surface;
   a bonding pad and an electrode are formed on the exposed surface of said pattern wiring part so as to project above said resin member first surface;
   a wire having a first end electrically connected to said bonding pad and a second end electrically connected to said semiconductor chip;

a sealing resin disposed over the first surface of said resin member so as to cover and encapsulate said bonding pad, said wire, and said semiconductor chip; wherein said electrode is exposed from said encapsulate.

7. A semiconductor package as claimed in claim 6, wherein a depth of the cavity is deeper than or equal to a thickness of the semiconductor chip.

8. A semiconductor package as claimed in claim 6, wherein the post part has a columnar shape and is formed by a plating method.

9. A semiconductor package as claimed in claim 6, wherein the cavity is defined by a plurality of sidewalls and a bottom wall, said bottom wall being generally perpendicular to said sidewalls and extending continuously and uninterrupted between the sidewalls so as to provide a continuous support for the semiconductor chip, and wherein said sealing resin partially fills said cavity so as to be disposed between said semiconductor chip and said plurality of sidewalls.

10. A semiconductor package as claimed in claim 6, wherein a die attachment film layer is interposed between the semiconductor chip second surface and the first surface of the resin member.

* * * * *